United States Patent
Kim et al.

(10) Patent No.: US 8,213,256 B2
(45) Date of Patent: Jul. 3, 2012

(54) ANTI-FUSE CIRCUIT AND SEMICONDUCTOR INTEGRATED CIRCUIT INCLUDING THE SAME

(75) Inventors: Hong-Jung Kim, Gyeonggi-do (KR); Jin-Hee Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/877,364

(22) Filed: Sep. 8, 2010

(65) Prior Publication Data

US 2012/0008448 A1  Jan. 12, 2012

(30) Foreign Application Priority Data

Jul. 6, 2010 (KR) .................. 10-2010-0064909

(51) Int. Cl.
*G11C 17/18* (2006.01)
(52) U.S. Cl. .............. 365/225.7; 365/196; 365/207; 365/189.07; 365/191; 365/230.06
(58) Field of Classification Search ............ 365/225.7, 365/196, 207, 189.07, 191, 230.06, 189.09
See application file for complete search history.

(56) References Cited

U.S. PATENT DOCUMENTS

2010/0124139 A1* 5/2010 Dono .................. 365/225.7

FOREIGN PATENT DOCUMENTS

JP 2007-080302 3/2007
JP 2009-277294 11/2009

OTHER PUBLICATIONS

Notice of Allowance issued by the Korean Intellectual Property Office on May 15, 2012.

* cited by examiner

*Primary Examiner* — Thong Q Le
(74) *Attorney, Agent, or Firm* — IP & T Group LLP (57) ABSTRACT

An anti-fuse circuit includes an anti-fuse coupled to a sensing node, a driving unit configured to rupture the anti-fuse in response to a rupture enable signal, an anti-fuse status detecting unit configured to output an anti-fuse status detecting signal in response to a voltage at the sensing node corresponding to a rupture status of the anti-fuse, and a sensing current supplying unit configured to supply sensing current to the sensing node in response to a rupture sensing signal.

19 Claims, 6 Drawing Sheets

ANTI-FUSE CIRCUIT AND SEMICONDUCTOR INTEGRATED CIRCUIT INCLUDING THE SAME

CROSS-REFERENCE TO RELATED APPLICATIONS

The present invention claims priority of Korean patent application number 10-2010-0064909, filed on Jul. 6, 2010, which is incorporated by reference in its entirety.

BACKGROUND OF THE INVENTION

Exemplary embodiments of the present invention relate to a semiconductor design technology, and more particularly, to an anti-fuse circuit and a semiconductor integrated circuit including the same.

Hereinafter, a semiconductor memory device is explained as a semiconductor integrated circuit in the preferred embodiment.

As semiconductor memory devices are being integrated with high density, the number of signal lines and memory cells included in a semiconductor memory device is increasing rapidly, and the line width of an internal circuit and the size of a memory cell are decreasing gradually due to space limitations, and thus, the possibility of a defect in a memory cell of a semiconductor memory device increases. Despite the increasing possibility of cell defects, semiconductor memory devices can be produced with a high yield by having a redundancy circuit for repairing defective memory cells. The redundancy circuit includes redundancy memory cells and fuses for programming repair addresses corresponding to defective memory cells.

In using redundancy circuits, a number of tests are performed upon completion of a wafer process. At this time, a memory cell, which is determined to be defective but repairable, is replaced with a redundancy memory cell. More specifically, a programming operation is performed in an internal circuit to replace an address corresponding to a defective memory cell with an address of a redundancy memory cell. Thus, when the address corresponding to the defective memory cell is input, the defective memory cell is replaced with the redundancy memory cell, so that the memory device can perform a normal operation. A fuse programming method may be used to program address information corresponding to a defective memory cell. An example of the fuse programming method is a physical fuse programming method that blows out a connected fuse using a laser beam.

However, the physical fuse programming method using a laser beam is possible only in a wafer state before a semiconductor memory device is packaged. Thus, instead of the physical programming method, an electrical programming method may be used to replace a defective memory cell with a redundancy memory cell in a package state. A fuse programmable in a package state is called an electrical fuse. An electrical fuse can be programmed by electrically changing the connection state of the electrical fuse. The electrical fuse comprises an anti-type fuse, which is also referred to as an 'anti-fuse.'

In general, the anti-fuse operates in opposite to a fuse. At an initial stage for fabricating a semiconductor memory device, the anti-type fuse maintains an open state. When a programming operation is performed, the anti-type fuse changes from the open state to a short-circuit state. More specifically, the anti-fuse at the initial stage for fabricating the semiconductor memory device acts as an insulator in a high resistivity state with resistance greater than 10 MΩ, and then, by programming, the anti-fuse becomes a conductor in a low resistivity state with resistance lower than hundreds of ohms. Here, the anti-fuse is physically changed into a conductor by applying a voltage greater than a predetermined level to an insulator between electrodes, i.e., two conductors, and breaking down the insulator.

Figure 1:
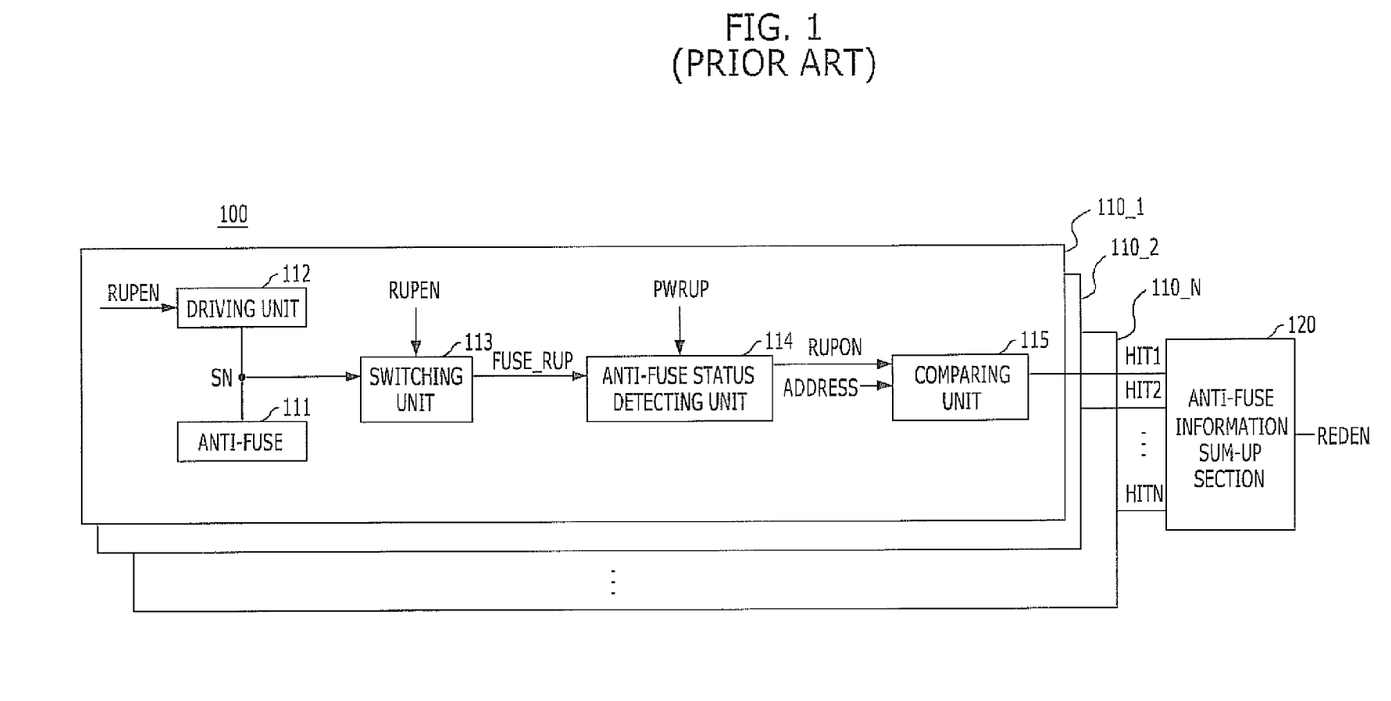
FIG. 1 shows a block diagram of a conventional semiconductor memory device including an anti-fuse circuit.

FIG. 1 shows a block diagram of a conventional semiconductor memory device including an anti-fuse circuit.

Referring to FIG. 1, the conventional semiconductor memory device 100 includes a plurality of anti-fuse sections 110_1 to 110_N and an anti-fuse information sum-up section 120. The anti-fuse sections 110_1 to 110_N output a plurality of anti-fuse information signals HIT1 to HITN, and the anti-fuse information sum-up section 120 outputs a redundancy enable signal REDEN in response to the anti-fuse information signals HIT1 to HITN.

Hereinafter, since all of the anti-fuse sections 110_1 to 110_N have substantially the same structure, only the first anti-fuse section 110_1 is explained for illustration purposes.

The first anti-fuse section 110_1 includes an anti-fuse 111, a driving unit 112, a switching unit 113, an anti-fuse status detecting unit 114, and a comparing unit 115. The anti-fuse 111 is coupled to a sensing node SN, the driving unit 112 ruptures the anti-fuse 111 in response to a rupture enable signal RUPEN. The anti-fuse status detecting unit 114 outputs an anti-fuse status detecting signal RUPON in response to variation of a voltage at the sensing node SN corresponding to a rupture status of the anti-fuse 111. The switching unit 113 connects or disconnects the driving unit 112 to/from the anti-fuse status detecting unit 114 in response to the rupture enable signal RUPEN, thereby selectively transferring the voltage at the sensing node SN to the anti-fuse status detecting unit 114 as an anti-fuse status signal FUSE_RUP. The comparing unit 115 compares the anti-fuse status detecting signal RUPON with an address signal ADDRESS to output a first anti-fuse information signal HIT1.

Figure 2:
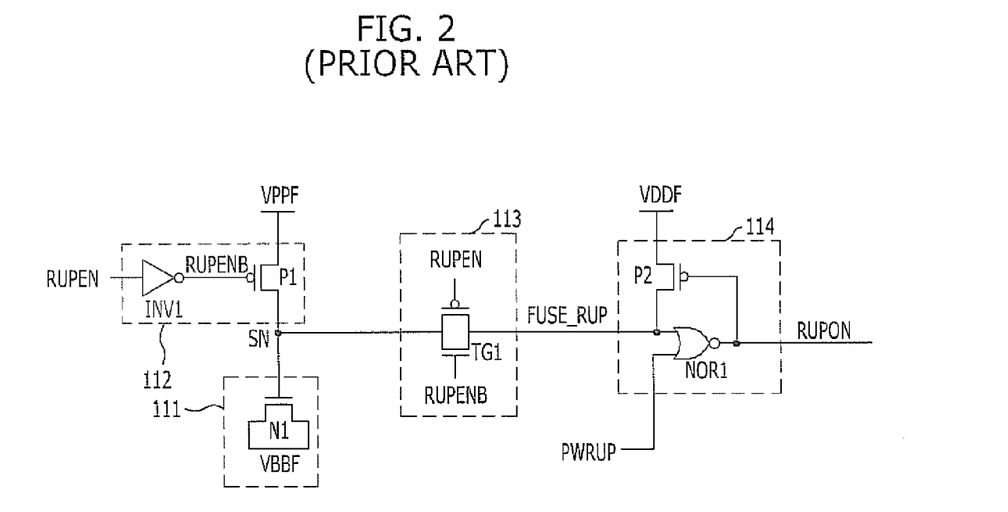
FIG. 2 shows a detailed circuit diagram of a first anti-fuse section shown in FIG. 1.

FIG. 2 shows a detailed circuit diagram of the anti-fuse 111, the driving unit 112, the switching unit 113, and the anti-fuse status detecting unit 114 included in the first anti-fuse section 110_1.

Referring to FIG. 2, the anti-fuse 111 comprises an NMOS transistor N1 whose gate is coupled to the sensing node SN and source and drain are coupled to a low voltage supply terminal VBBF in common. Here, a ground voltage VSS is supplied to the low voltage supply terminal VBBF when the rupture enable signal RUPEN is inactivated, and a back bias voltage VBB having a voltage level lower than the ground voltage VSS is supplied to the low voltage supply terminal VBBF when the rupture enable signal RUPEN is activated.

The driving unit 112 comprises a first inverter INV1 and a pull-up driving unit P1. The first inverter INV1 inverts the rupture enable signal RUPEN to output a pull-up driving signal RUPENB, the pull-up driving unit P1 couples the sensing node SN to a first high voltage (VPP) supply terminal VPPF in response to the pull-up driving signal RUPENB. Here, the pull-up driving unit P1 includes a first PMOS transistor having a gate receiving the pull-up driving signal RUPENB and a source-drain path coupled between the first high voltage supply terminal VPPF and the sensing node SN.

The switching unit 113 comprises a transmission gate TG1 which selectively outputs the voltage at the sensing node SN as the anti-fuse status signal FUSE_RUP in response to the rupture enable signal RUPEN and the pull-up driving signal RUPENB.

The anti-fuse status detecting unit 114 comprises a NOR gate NOR1 and a second PMOS transistor P2. The NOR gate NOR1 performs a NOR operation on the anti-fuse status signal FUSE_RUP and a power up signal PWRUP to output the anti-fuse status detecting signal RUPON. The second PMOS transistor P2 has a gate receiving the anti-fuse status detecting signal RUPON, and a source-drain path between a second high voltage (VDD) supply terminal VDDF and an output terminal of the switching unit 113. Herein, the second high voltage supply terminal VDDF supplies a second high voltage VDD having a voltage level lower than a first high voltage VPP supplied from the first high voltage supply terminal VPPF.

Although not shown, the comparing unit 115 outputs the first anti-fuse information signal HIT1 of a logic high level when the anti-fuse status detecting signal RUPON has the same logic level as the address signal ADDRESS. The comparing unit 115 outputs the first anti-fuse information signal HIT1 of a logic low level when the anti-fuse status detecting signal RUPON has a logic level different from the address signal ADDRESS.

Hereinafter, an operation of the conventional semiconductor memory device including the anti-fuse circuit is explained in detail.

Figure 3:
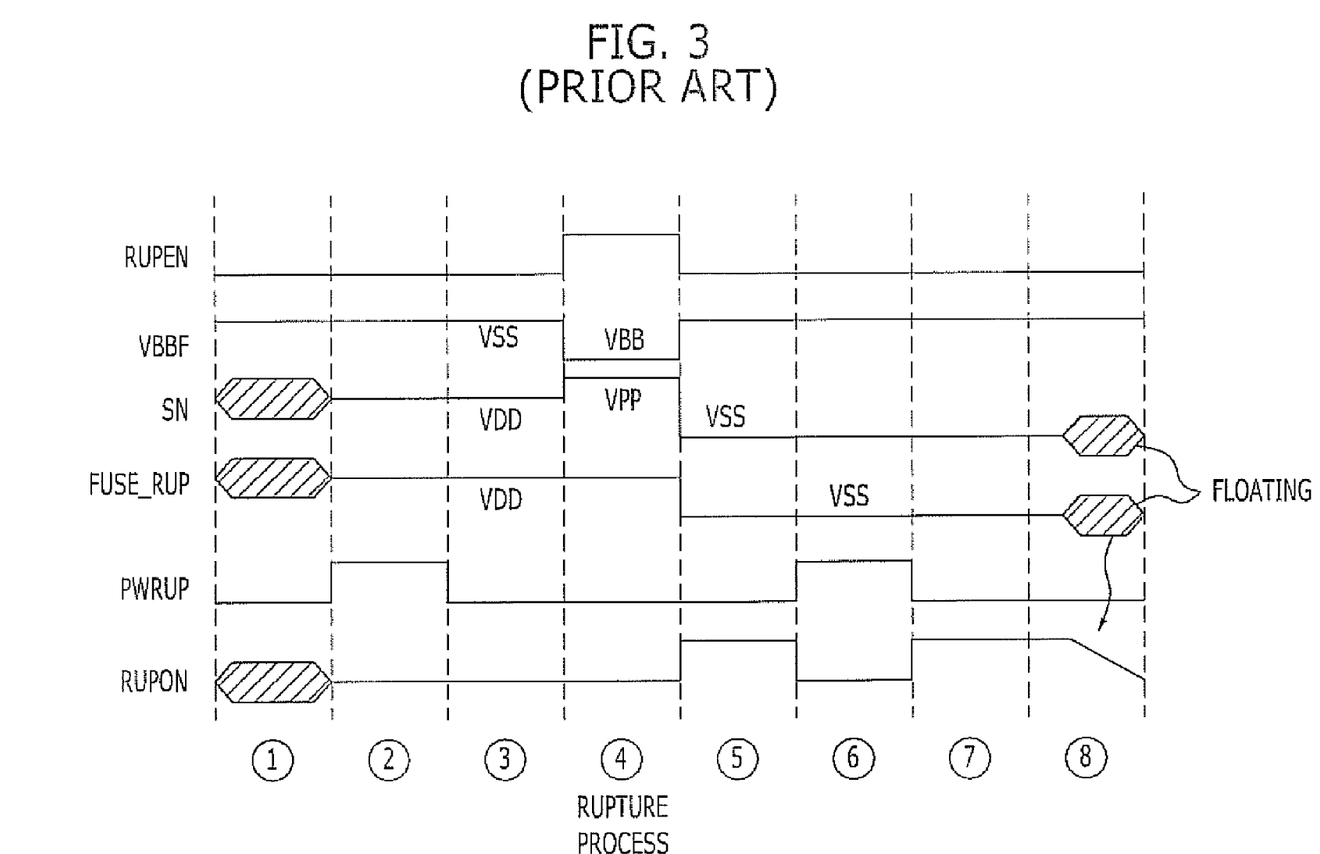
FIG. 3 is a waveform diagram illustrating an operation of the conventional semiconductor memory device including the anti-fuse circuit shown in FIG. 1.

FIG. 3 is a waveform diagram illustrating an operation of the conventional semiconductor memory device including the anti-fuse circuit shown in FIG. 1.

First, when the rupture enable signal RUPEN is inactivated to a logic low level, the ground voltage VSS is supplied to the source and drain of the NMOS transistor N1 through the low voltage supply terminal VBBF. The pull-up driving unit P1 is disabled while the switching unit 113 maintains a turn-on state. (①)

When the power up signal PWRUP is activated, the anti-fuse status detecting unit 114 outputs the anti-fuse status detecting signal RUPON of a logic low level. (②) In detail, since the NOR gate NOR1 included in the anti-fuse status detecting unit 114 receives the power up signal PWRUP of a logic high level, the NOR gate NOR1 outputs the anti-fuse status detecting signal RUPON of a logic low level regardless of a logic level of the anti-fuse status signal FUSE_RUP. Subsequently, the second PMOS transistor P2 drives the sensing node SN to the second high voltage VDD in response to the anti-fuse status detecting signal RUPON of a logic low level. More specifically, the sensing node SN is precharged to the second high voltage VDD according as the power up signal PWRUP is activated. Thereafter, even if the power up signal PWRUP is inactivated to a logic low level, the anti-fuse status detecting unit 114 maintains the anti-fuse status detecting signal RUPON of a logic low level by a latch operation. (③)

Then, the rupture enable signal RUPEN is activated, the back bias voltage VBB whose voltage level is lower than the ground voltage VSS is supplied to the source and drain of the NMOS transistor N1 through the low voltage supply terminal VBBF. The pull-up driving unit P1 is enabled while the switching unit 113 enters a turn-off state. Accordingly, the anti-fuse 111 is ruptured due to a high voltage difference between two terminals, i.e., the first voltage VPP is supplied to one terminal and the back bias voltage VBB is supplied to the other terminal. During the above "rupture" process, the anti-fuse 111 becomes a low resistivity state from a high resistivity state so that the low voltage supply terminal VBBF is coupled to the sensing node SN by breaking a gate oxide layer of the NMOS transistor N1 included in the anti-fuse 111. (④)

After completing the "rupture" process, the rupture enable signal RUPEN is inactivated. The ground voltage VSS is supplied to the source and drain of the NMOS transistor N1 through the low voltage supply terminal VBBF. The pull-up driving unit P1 is disabled while the switching unit 113 maintains a turn-on state. Accordingly, the anti-fuse status detecting unit 114 outputs the anti-fuse status detecting signal RUPON of a logic high level based on the anti-fuse status signal FUSE_RUP of a logic low level according to the ground voltage VSS supplied to the source and drain of the NMOS transistor N1 through the low voltage supply terminal VBBF. (⑤)

Thereafter, the power up signal PWRUP is activated and the anti-fuse status detecting signal RUPON is temporarily transited to a logic low level. (⑥) After the power up signal PWRUP is inactivated, the anti-fuse status detecting unit 114 maintains the anti-fuse status detecting signal RUPON of a logic high level since the sensing node SN is coupled to the low voltage supply terminal VBBF supplying the ground voltage VSS. (⑦)

When the address signal ADDRESS is input, the comparing unit 115 outputs the first anti-fuse information signal HIT1 by comparing the address signal ADDRESS with the anti-fuse status detecting signal RUPON. For example, the comparing unit 115 outputs the first anti-fuse information signal HIT1 of a logic high level when the anti-fuse status detecting signal RUPON has the same logic level as the address signal ADDRESS. On the other hand, the comparing unit 115 outputs the first anti-fuse information signal HIT1 of a logic low level when the anti-fuse status detecting signal RUPON has a logic level different from the address signal ADDRESS.

The other anti-fuse sections 110_2 to 110_N performs substantially the same operation as that of the first anti-fuse section 110_1 to output second to N-th anti-fuse information signals HIT2 to HITN.

The anti-fuse information sum-up section 120 outputs the redundancy enable signal REDEN in response to the anti-fuse information signals HIT1 to HITN. For example, the anti-fuse information sum-up section 120 activates the redundancy enable signal REDEN when all of the anti-fuse information signals HIT1 to HITN are activated to a logic high level. On the other hand, the anti-fuse information sum-up section 120 inactivates the redundancy enable signal REDEN when any of the anti-fuse information signals HIT1 to HITN is inactivated to a logic low level.

As described above, the conventional semiconductor memory device including the anti-fuse circuit can repair defective memory cells in a package state, thereby achieving a high yield of the semiconductor memory device.

However, after the "rupture" process, impedance of the anti-fuse 111 included in the conventional semiconductor memory device increases as time elapses. More specifically, the broken gate oxide layer of the NMOS transistor N1 is slowly restored again as time elapses. At this time, as soon as the "rupture" process is finished, the anti-fuse status detecting signal RUPON is output normally. However, after a predetermined time elapses, an abnormal anti-fuse status detecting signal RUPON may be output.

SUMMARY OF THE INVENTION

An embodiment of the present invention is directed to an anti-fuse circuit and a semiconductor integrated circuit including the same capable of filtering/screening an anti-fuse which does not reach a predetermined rupture level after a rupture process.

In accordance with an embodiment of the present invention, a anti-fuse circuit includes: an anti-fuse configured to be coupled to a sensing node; a driving unit configured to rupture the anti-fuse in response to a rupture enable signal; an anti-fuse status detecting unit configured to output an anti-fuse status detecting signal in response to a voltage at the sensing node corresponding to a rupture status of the anti-fuse; and a sensing current supplying unit configured to supply sensing current to the sensing node in response to a rupture sensing signal.

In accordance with another aspect embodiment of the present invention, a semiconductor integrated circuit includes: a plurality of anti-fuse sections configured to output a plurality of anti-fuse information signals; and an anti-fuse information sum-up section configured to output a redundancy enable signal in response to the anti-fuse information signals, wherein each of the anti-fuse sections comprises: an anti-fuse configured to be coupled to a sensing node; a driving unit configured to rupture the anti-fuse in response to a rupture enable signal; an anti-fuse status detecting unit configured to output an anti-fuse status detecting signal in response to a voltage at the sensing node corresponding to a rupture status of the anti-fuse; a sensing current supplying unit configured to supply sensing current to the sensing node in response to a rupture sensing signal; and a comparing unit configured to compare the anti-fuse status detecting signal with an address signal to output a corresponding one of the anti-fuse information signals.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
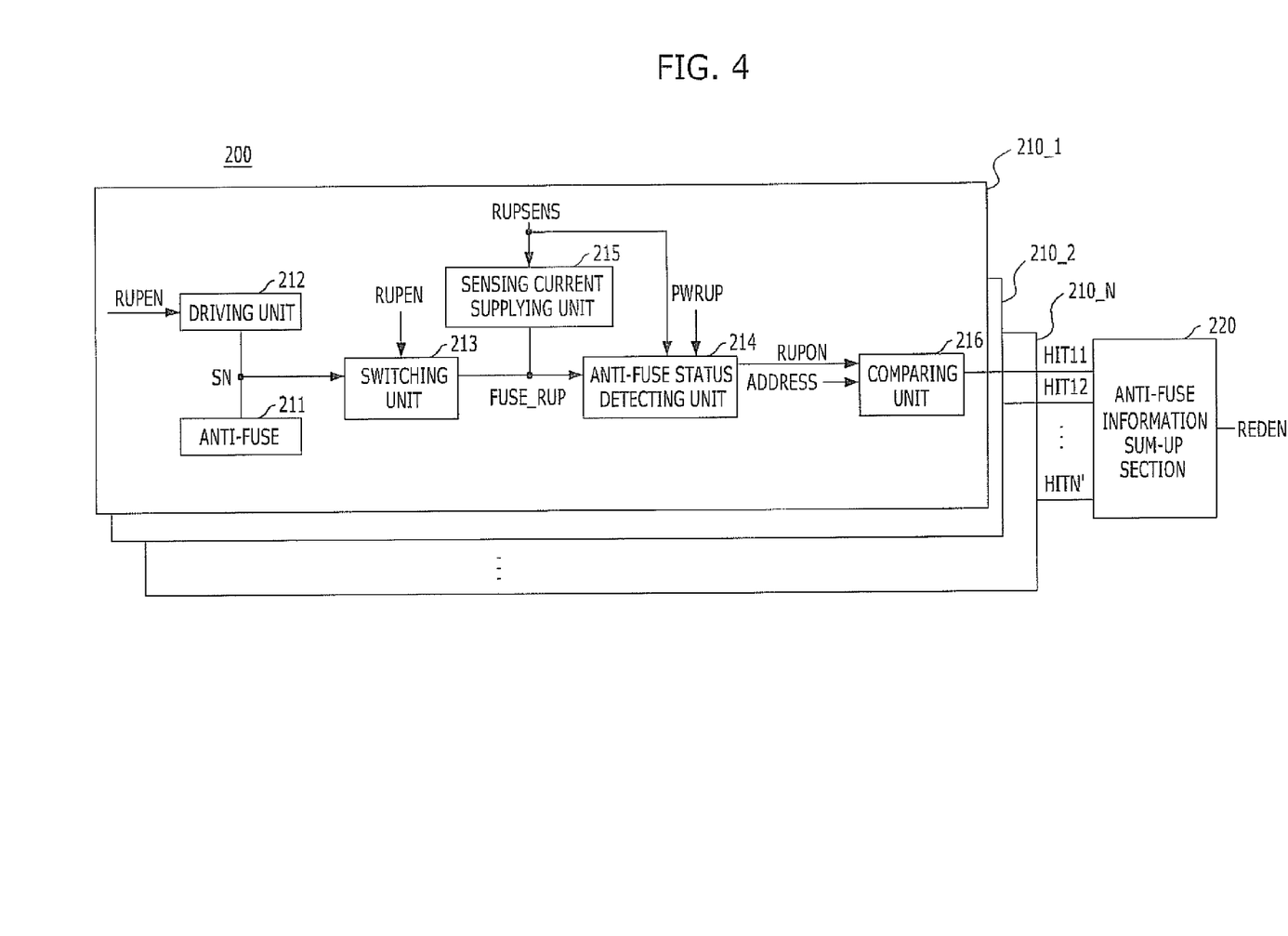
FIG. 4 shows a block diagram of a semiconductor memory device including an anti-fuse circuit in accordance with an embodiment of the present invention.

FIG. 4 shows a block diagram of a semiconductor memory device including an anti-fuse circuit in accordance with an embodiment of the present invention.

Hereinafter, a semiconductor memory device is explained as a semiconductor integrated circuit in the preferred embodiment.

Referring to FIG. 4, the semiconductor memory device 200 includes a plurality of anti-fuse sections 210_1 to 210_N and an anti-fuse information sum-up section 220. The anti-fuse sections 210_1 to 210_N output a plurality of anti-fuse information signals HIT11 to HITN', and the anti-fuse information sum-up section 220 outputs a redundancy enable signal REDEN in response to the anti-fuse information signals HIT11 to HITN'.

Hereinafter, since the anti-fuse sections 210_1 to 210_N have substantially the same structure, only the first anti-fuse section 210_1 is explained for conciseness.

The first anti-fuse section 210_1 includes an anti-fuse 211, a driving unit 212, a switching unit 213, an anti-fuse status detecting unit 214, a sensing current supplying unit 215, and a comparing unit 216.

The anti-fuse 211 is coupled to a sensing node SN, the driving unit 212 ruptures the anti-fuse 211 in response to a rupture enable signal RUPEN. The anti-fuse status detecting unit 214 outputs an anti-fuse status detecting signal RUPON in response to variation of a voltage at the sensing node SN corresponding to a rupture status of the anti-fuse 211. The sensing current supplying unit 215 supplies sensing current to the sensing node SN in response to a rupture sensing signal RUPSENS. The switching unit 213 connects or disconnects the driving unit 212 to/from the anti-fuse status detecting unit 214 in response to the rupture enable signal RUPEN, thereby selectively transferring the voltage at the sensing node SN to the anti-fuse status detecting unit 214 as an anti-fuse status signal FUSE_RUP. The comparing unit 216 compares the anti-fuse status detecting signal RUPON with an address signal ADDRESS to output a first anti-fuse information signal HIT11.

Figure 5:
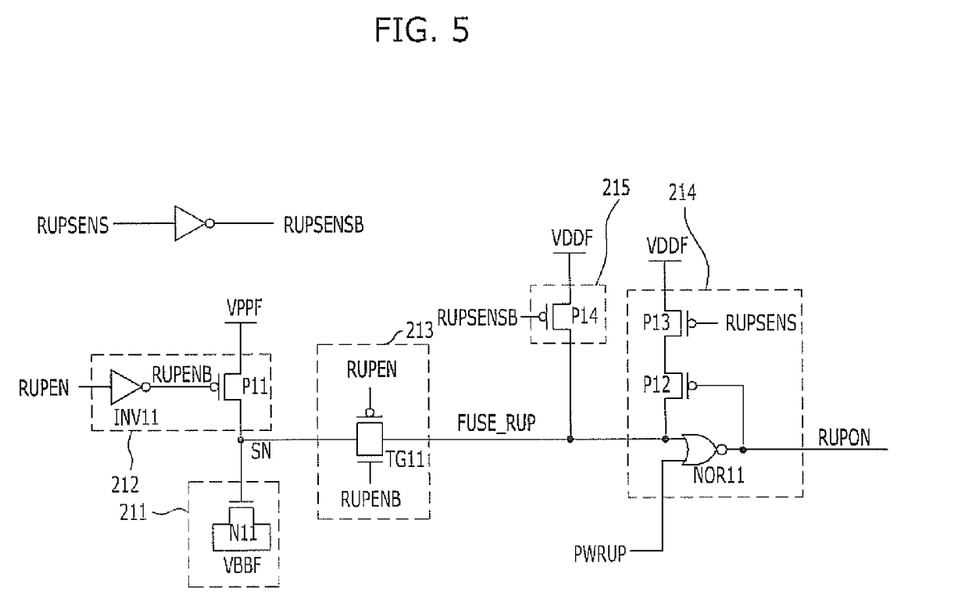
FIG. 5 shows a detailed circuit diagram of a first anti-fuse section shown in FIG. 4.

FIG. 5 shows a detailed circuit diagram of the anti-fuse 211, the driving unit 212, the switching unit 213, the anti-fuse status detecting unit 214, and the sensing current supplying unit 215 included in the first anti-fuse section 210_1.

Referring to FIG. 5, the anti-fuse 211 comprises an NMOS transistor N11 whose gate is coupled to the sensing node SN and source and drain are coupled to a low voltage supply terminal VBBF in common. Here, a ground voltage VSS is supplied to the low voltage supply terminal VBBF when the rupture enable signal RUPEN is inactivated, and a back bias voltage VBB having a voltage level lower than the ground voltage VSS is supplied to the low voltage supply terminal VBBF when the rupture enable signal RUPEN is activated.

The driving unit 212 comprises a first inverter INV11 and a pull-up driving unit P11. The first inverter INV11 inverts the rupture enable signal RUPEN to output a pull-up driving signal RUPENB, the pull-up driving unit P11 couples the sensing node SN to a first high voltage (VPP) supply terminal VPPF in response to the pull-up driving signal RUPENB. Here, the pull-up driving unit P11 includes a first PMOS transistor having a gate receiving the pull-up driving signal RUPENB and a source-drain path coupled between the first high voltage supply terminal VPPF and the sensing node SN.

The switching unit 213 comprises a transmission gate TG11 which selectively outputs the voltage at the sensing node SN as the anti-fuse status signal FUSE_RUP in response to the rupture enable signal RUPEN and the pull-up driving signal RUPENB.

The anti-fuse status detecting unit 214 comprises a NOR gate NOR11 and second and third PMOS transistors P12 and P13. The NOR gate NOR11 performs a NOR operation on the anti-fuse status signal FUSE_RUP and a power up signal PWRUP to output the anti-fuse status detecting signal RUPON. The second PMOS transistor P12 has a gate receiving the anti-fuse status detecting signal RUPON, and a drain coupled to an output terminal of the switching unit 213. The third PMOS transistor P13 has a gate receiving the rupture sensing signal RUPSENS, and a source-drain path between a second high voltage (VDD) supply terminal VDDF and a source of the second PMOS transistor P12. Herein, the second high voltage supply terminal VDDF supplies a second voltage VDD having a voltage level lower than a first voltage VPP supplied from the first high voltage supply terminal VPPF.

The sensing current supplying unit 215 comprises a fourth PMOS transistor P14 which has a gate receiving an inversion signal of the rupture sensing signal RUPSENSB, and a source-drain path between the second high voltage supply terminal VDDF and the output terminal of the switching unit 213. Here, the fourth PMOS transistor P14 may have a driving capacity greater than the second PMOS transistor P12 so that current flowing the sensing node through the fourth PMOS transistor P14 is greater than current flowing the sensing node through the second PMOS transistor P12.

Although not shown, the comparing unit 216 outputs the first anti-fuse information signal HIT11 of a logic high level when the anti-fuse status detecting signal RUPON has the same logic level as the address signal ADDRESS. The comparing unit 216 outputs the first anti-fuse information signal HIT11 of a logic low level when the anti-fuse status detecting signal RUPON has a logic level different from the address signal ADDRESS.

Hereinafter, an operation of the semiconductor memory device including the anti-fuse circuit in accordance with the embodiment is explained in detail.

Figure 6:
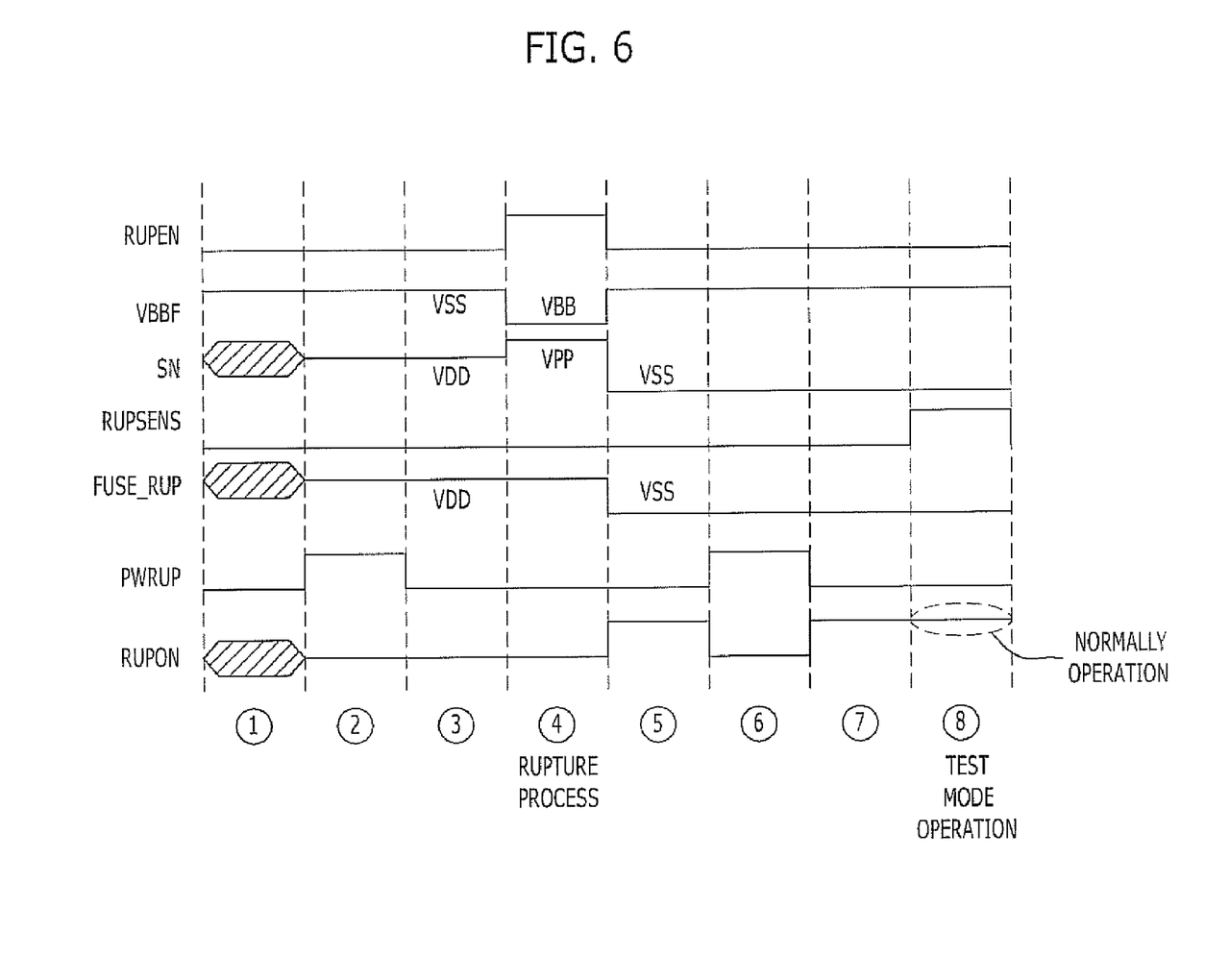
FIG. 6 is a waveform diagram illustrating an operation of the semiconductor memory device including the anti-fuse circuit shown in FIG. 4.

FIG. 6 is a waveform diagram illustrating an operation of the semiconductor memory device 200 including the anti-fuse circuit shown in FIG. 4.

First, when the rupture enable signal RUPEN is inactivated to a logic low level, the ground voltage VSS is supplied to the source and drain of the NMOS transistor N11 through the low voltage supply terminal VBBF. Since the rupture enable signal RUPEN is inactivated, the pull-up driving unit P11 is disabled and the switching unit 113 maintains a turn-on state. (①) At this time, the rupture sensing signal RUPSENS is inactivated to a logic low level, and thus the third PMOS transistor P13 is turned on so that the source of the second PMOS transistor P12 is coupled to the second high voltage supply terminal VDDF. Here, the rupture sensing signal RUPSENS is generated based on a test mode signal.

When the power up signal PWRUP is activated to a logic high level, the anti-fuse status detecting unit 214 outputs the anti-fuse status detecting signal RUPON of a logic low level. (②) In detail, since the NOR gate NOR11 included in the anti-fuse status detecting unit 214 receives the power up signal PWRUP of a logic high level, the NOR gate NOR11 outputs the anti-fuse status detecting signal RUPON of a logic low level regardless of a logic level of the anti-fuse status signal FUSE_RUP. Subsequently, the second PMOS transistor P12 drives the sensing node SN to the second high voltage VDD in response to the anti-fuse status detecting signal RUPON of a logic low level. At this time, the third PMOS transistor P13 maintains a turn-on state in response to the rupture sensing signal RUPSENS of a logic low level. As a result, the sensing node SN is precharged to the second high voltage VDD according as the power up signal PWRUP is activated. Thereafter, even if the power up signal PWRUP is inactivated to a logic low level, the anti-fuse status detecting unit 214 maintains the anti-fuse status detecting signal RUPON of a logic low level by a latch operation. (③)

Then, the rupture enable signal RUPEN is activated, the back bias voltage VBB whose voltage level is lower than the ground voltage VSS is supplied to the source and drain of the NMOS transistor N11 through the low voltage supply terminal VBBF. The pull-up driving unit P11 is enabled while the switching unit 213 becomes a turn-off state. Accordingly, the anti-fuse 211 is ruptured due to a high voltage difference between two terminals, i.e., a voltage difference when the first voltage VPP supplied to one terminal and the back bias voltage VBB supplied to the other terminal. During the above-described "rupture" process, the anti-fuse 211 enters a low resistivity state from a high resistivity state so that the low voltage supply terminal VBBF is coupled to the sensing node SN by breaking a gate oxide layer of the NMOS transistor N11 included in the anti-fuse 211. (④)

After completing the "rupture" process, the rupture enable signal RUPEN is inactivated. The ground voltage VSS is supplied to the source and drain of the NMOS transistor N11 through the low voltage supply terminal VBBF. The pull-up driving unit P11 is disabled while the switching unit 213 maintains a turn-on state. Accordingly, the anti-fuse status detecting unit 214 outputs the anti-fuse status detecting signal RUPON of a logic high level based on the anti-fuse status signal FUSE_RUP of a logic low level according to the ground voltage VSS supplied to the source and drain of the NMOS transistor N11 through the low voltage supply terminal VBBF. (⑤)

Thereafter, the power up signal PWRUP is activated and the anti-fuse status detecting signal RUPON temporarily transitions to a logic low level. (⑥) After the power up signal PWRUP is inactivated, the anti-fuse status detecting unit 214 maintains the anti-fuse status detecting signal RUPON of a logic high level since the sensing node SN is coupled to the low voltage supply terminal VBBF supplying the ground voltage VSS. (⑦)

A test mode operation is performed by sensing a rupture degree of an anti-fuse so as to filter/screen the anti-fuse which does not reach a predetermined level of rupture. (⑧)

The test mode operation is as follows.

When the rupture sensing signal RUPSENS is activated to a logic high level, the third PMOS transistor P13 is turned-off so as to disconnect the source of the second PMOS transistor P12 from the second high voltage supply terminal VDDF. The fourth PMOS transistor P14 included in the sensing current supplying unit 215 is turned on so as to supply the sensing current corresponding to a preset driving capacity to the sensing node SN. As a result, impedance of the anti-fuse 211 at the sensing node SN increases in relation to a reference impedance used by the anti-fuse status detecting unit 214, which determines the anti-fuse status detecting signal RUPON based on, for example, a comparison between the two impedances, so that the anti-fuse status detecting unit 214 may detect the rupture degree of the anti-fuse 211. More specifically, the anti-fuse status detecting unit 214 may filter/screen the anti-fuse 211 which is expected not to reach a predetermined level of rupture after a period of time from performing the rupture process.

For example, when it is assumed that the reference impedance is 50Ω in a normal mode, the reference impedance is adjusted to 30Ω in a test mode by taking the fact that the impedance of the anti-fuse 211 increases as time elapses into consideration. Accordingly, when the anti-fuse 211 has a compliant impedance in the test mode (e.g., impedance less than the reference impedance in the test mode), the anti-fuse 211 is expected to normally operate in the normal mode even if the impedance of the anti-fuse 211 increases as time elapses. As a result, an operational reliability of the anti-fuse 211 after the rupture process may be secured.

When the voltage at the sensing node SN is greater than a threshold voltage of elements included in the NOR gate NOR11 with the sensing current supplying unit 215 supplying the sensing current to the sensing node SN during the test mode, the broken gate oxide layer of the anti-fuse 211 is not expected to remain as short-circuited with time elapse. Here, the NOR gate NOR11 outputs the anti-fuse status detecting signal RUPON of a logic low level. As a result, the anti-fuse expected to malfunction during a normal mode despite completing the rupture process may be screened/filtered out when the anti-fuse status detecting signal RUPON has a logic low level.

On the other hand, when the NOR gate NOR11 outputs the anti-fuse status detecting signal RUPON of a logic high level when the sensing current supplying unit 215 supplies the sensing current to the sensing node SN during a test mode, the anti-fuse 211 is expected to be normally operated in the normal mode even with a time elapse. As a result, the anti-fuse is not screened/filtered out.

After finishing the test mode operation, the address signal ADDRESS is input. The comparing unit 216 outputs the first anti-fuse information signal HIT11 by comparing the address signal ADDRESS with the anti-fuse status detecting signal RUPON. For example, the comparing unit 216 outputs the first anti-fuse information signal HIT11 of a logic high level when the anti-fuse status detecting signal RUPON has the same logic level as the address signal ADDRESS. On the other hand, the comparing unit 216 outputs the first anti-fuse information signal HIT11 of a logic low level when the anti-fuse status detecting signal RUPON has a logic level different from the address signal ADDRESS.

Likewise, the other anti-fuse sections 210_2 to 210_N performs substantially the same operation as that of the first anti-fuse section 210_1 to output second to N-th anti-fuse information signals HIT12 to HITN'.

The anti-fuse information sum-up section 220 outputs the redundancy enable signal REDEN in response to the anti-fuse information signals HIT11 to HITN'. For example, the anti-fuse information sum-up section 220 activates and outputs the redundancy enable signal REDEN when all of the anti-fuse information signals HIT11 to HITN' are activated to a logic high level. On the other hand, the anti-fuse information sum-up section 220 inactivates and outputs the redundancy enable signal REDEN when any of the anti-fuse information signals HIT11 to HITN' is inactivated to a logic low level.

In accordance with the embodiments of the present invention, an anti-fuse expected to be poor is filtered/screened out in advance by detecting whether a rupture degree of the anti-fuse is lower than a predetermined rupture level in a test mode. Accordingly, an operational reliability of the anti-fuse may be secured in a normal mode.

While the invention has been described with respect to the specific embodiments, it will be apparent to those skilled in the art that various changes and modifications may be made without departing from the spirit and scope of the invention as defined in the following claims.

What is claimed is:

1. An anti-fuse circuit, comprising:
an anti-fuse coupled to a sensing node;
a driving unit configured to rupture the anti-fuse in response to a rupture enable signal, wherein the rupture enable signal is generated based on a test mode signal;
an anti-fuse status detecting unit configured to output an anti-fuse status detecting signal in response to a voltage at the sensing node corresponding to a rupture status of the anti-fuse; and
a sensing current supplying unit configured to supply sensing current to the sensing node in response to a rupture sensing signal.

2. The anti-fuse circuit of claim 1, further comprising:
a switching unit configured to connect or disconnect the driving unit to/from the anti-fuse status detecting unit in response to the rupture enable signal so as to selectively transfer the voltage at the sensing node to the anti-fuse status detecting unit.

3. The anti-fuse circuit of claim 1, wherein the driving unit drives the sensing node to a first high voltage in response to the rupture enable signal.

4. The anti-fuse circuit of claim 3, wherein the anti-fuse comprises:
an NMOS transistor having a gate coupled to the sensing node and a source and a drain coupled to a low voltage supply terminal in common.

5. The anti-fuse circuit of claim 3, wherein the anti-fuse status detecting unit comprises:
a NOR gate configured to perform a NOR operation on the voltage at the sensing node and a power up signal to output the anti-fuse status detecting signal; and
a first PMOS transistor having a gate to receive the anti-fuse status detecting signal, and a source-drain path coupled between a second high voltage supply terminal and the sensing node, wherein the second high voltage supply terminal supplies a second voltage having a voltage level lower than a first voltage supplied from the first high voltage supply terminal.

6. The anti-fuse circuit of claim 5, wherein the anti-fuse status detecting unit further comprises:
a selective connection unit configured to selectively couple the second high voltage supply terminal to a source of the first PMOS transistor.

7. The anti-fuse circuit of claim 5, wherein the sensing current supplying unit comprises:
a second PMOS transistor configured to have a gate receiving an inversion signal of the rupture sensing signal, and a source-drain path between the second high voltage supply terminal and the sensing node.

8. The anti-fuse circuit of claim 7, wherein the second PMOS transistor has a driving capacity greater than the first PMOS transistor so that current flowing the sensing node through the second PMOS transistor is greater than current flowing the sensing node through the first PMOS transistor.

9. The anti-fuse circuit of claim 1, wherein the sensing current supplying unit is configured to increase a value of a reference resistance during a test mode as compared to that of a normal mode and the anti-fuse status detecting unit is configured to compare the resistance of the anti-fuse to the reference resistance in determining whether the anti-fuse is to be screened out.

10. A semiconductor memory device including the anti-fuse circuit of claim 4, wherein the semiconductor memory device is configured to supply a ground voltage to the source and drain of the NMOS transistor through the low voltage supply terminal when the rupture enable signal is inactivated and supply a back bias voltage having a voltage level lower than the ground voltage to the source and drain of the NMOS transistor through the low voltage supply terminal when the rupture enable signal is activated.

11. A semiconductor integrated circuit, comprising:
a plurality of anti-fuse sections configured to output a plurality of anti-fuse information signals; and
an anti-fuse information sum-up section configured to output a redundancy enable signal in response to the anti-fuse information signals,
wherein each of the anti-fuse sections comprises:
an anti-fuse configured to be coupled to a sensing node;
a driving unit configured to rupture the anti-fuse in response to a rupture enable signal;

an anti-fuse status detecting unit configured to output an anti-fuse status detecting signal in response to a voltage at the sensing node corresponding to a rupture status of the anti-fuse;

a sensing current supplying unit configured to supply sensing current to the sensing node in response to a rupture sensing signal; and a comparing unit configured to compare the anti-fuse status detecting signal with an address signal to output a corresponding one of the anti-fuse information signals.

12. The semiconductor integrated circuit of claim 11, further comprising:

a switching unit configured to connect or disconnect the driving unit to/from the anti-fuse status detecting unit in response to the rupture enable signal so as to selectively transfer the voltage at the sensing node to the anti-fuse status detecting unit.

13. The semiconductor integrated circuit of claim 11, wherein the driving unit drives the sensing node to a first high voltage in response to the rupture enable signal.

14. The semiconductor integrated circuit of claim 13, wherein the anti-fuse comprises:

an NMOS transistor having a gate coupled to the sensing node and a source and a drain coupled to a low voltage supply terminal in common.

15. The semiconductor integrated circuit of claim 13, wherein the anti-fuse status detecting unit comprises:

a NOR gate configured to perform a NOR operation on the voltage at the sensing node and a power up signal to output the anti-fuse status detecting signal; and a first PMOS transistor having a gate to receive the anti-fuse status detecting signal, and a source-drain path coupled between a second high voltage supply terminal and the sensing node, wherein the second high voltage supply terminal supplies a second voltage having a voltage level lower than a first voltage supplied from the first high voltage supply terminal.

16. The semiconductor integrated circuit of claim 15, wherein the anti-fuse status detecting unit further comprises:

a selective connection unit configured to selectively couple the second high voltage supply terminal to a source of the first PMOS transistor.

17. The semiconductor integrated circuit of claim 15, wherein the sensing current supplying unit comprises:

a second PMOS transistor having a gate to receive an inversion signal of the rupture sensing signal, and a source-drain path between the second high voltage supply terminal and the sensing node.

18. The semiconductor integrated circuit of claim 17, wherein the second PMOS transistor has a driving capacity greater than the first PMOS transistor so that current flowing the sensing node through the second PMOS transistor is greater than current flowing the sensing node through the first PMOS transistor.

19. The semiconductor integrated circuit of claim 11, wherein the rupture enable signal is generated based on a test mode signal.

* * * * *